US012755672B2

(12) United States Patent
Li et al.

(10) Patent No.: US 12,755,672 B2
(45) Date of Patent: Oct. 6, 2026

(54) DISPLAY APPARATUSES, DISPLAY PANELS, AND METHODS OF DRIVING DISPLAY PANELS

(71) Applicants: BOE MLED Technology Co., Ltd., Beijing (CN); BOE Technology Group Co., Ltd., Beijing (CN)

(72) Inventors: Xiuling Li, Beijing (CN); Qibing Gu, Beijing (CN); Guofeng Hu, Beijing (CN); Bao Fu, Beijing (CN); Wenchieh Huang, Beijing (CN); Lingyun Shi, Beijing (CN)

(73) Assignees: BOE MLED Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 195 days.

(21) Appl. No.: 17/914,180

(22) PCT Filed: Aug. 20, 2021

(86) PCT No.: PCT/CN2021/113910
§ 371 (c)(1),
(2) Date: Sep. 23, 2022

(87) PCT Pub. No.: WO2023/019598
PCT Pub. Date: Feb. 23, 2023

(65) Prior Publication Data
US 2024/0221606 A1 Jul. 4, 2024

(51) Int. Cl.
*G09G 3/32* (2016.01)
*G09G 3/20* (2006.01)
(Continued)

(52) U.S. Cl.
CPC ............. *G09G 3/32* (2013.01); *G09G 3/2085* (2013.01); *G09G 3/2088* (2013.01);
(Continued)

(58) Field of Classification Search
CPC ......... G09G 3/3233; G09G 2300/0426; G09G 2310/0262; G09G 3/3688;
(Continued)

(56) References Cited

U.S. PATENT DOCUMENTS 10,483,253 B1 * 11/2019 Hu ...................... H10W 70/614
2005/0017268 A1 * 1/2005 Tsukamoto ............ H10K 59/18 257/200
(Continued)

FOREIGN PATENT DOCUMENTS

CN 102077167 A 5/2011
CN 102160181 A 8/2011
(Continued)

OTHER PUBLICATIONS

PCT/CN2021/113910 international search report.
(Continued)

*Primary Examiner* — Dismery Mercedes
(74) *Attorney, Agent, or Firm* — IPro, PLLC

(57) ABSTRACT

The present disclosure provides a display apparatus, a display panel, and a method of driving a display panel. The display panel includes: a base substrate; a pixel array disposed on the base substrate, and including one or more pixel groups each of which includes a plurality of pixels; and a plurality of pixel driving chips disposed on the base substrate and configured to drive the pixel array to display, each of the pixel driving chips including a data signal terminal for receiving data signals and a control signal terminal, where for each of the pixel groups, the plurality of pixels in the pixel group are connected to a common pixel driving chip. A display frame of the display panel includes an address assignment stage and a data signal transmission stage. The method includes: inputting the control signal to the control signal terminal and inputting a first data signal to
(Continued)

the data signal terminal in the address assignment stage; and inputting a second data signal to the data signal terminal in the data signal transmission stage. The present disclosure can reduce the number of signal lines and reduce power consumption.

20 Claims, 7 Drawing Sheets

(51) Int. Cl.

| | |
|---|---|
| ***G09G 3/3266*** | (2016.01) |
| ***H10D 86/40*** | (2025.01) |
| ***H10D 86/60*** | (2025.01) |
| ***H10W 90/00*** | (2026.01) |

(52) U.S. Cl.
CPC ......... *G09G 3/3266* (2013.01); *H10D 86/441* (2025.01); *H10D 86/60* (2025.01); *H10W 90/00* (2026.01); *G09G 2300/0408* (2013.01); *G09G 2300/0426* (2013.01); *G09G 2310/0202* (2013.01); *G09G 2310/0262* (2013.01); *G09G 2330/021* (2013.01); *G09G 2370/00* (2013.01)

(58) Field of Classification Search
CPC ........... G09G 2330/021; G09G 3/2088; G09G 3/2085; G09G 2310/0202; G09G 2320/0295; G09G 3/2096; H10K 59/131; H10K 59/1213; H10K 59/129; H10W 90/00
See application file for complete search history.

(56) References Cited

U.S. PATENT DOCUMENTS

| | | | | |
|---|---|---|---|---|
| 2009/0322649 | A1 | 12/2009 | Hamer et al. | |
| 2010/0039030 | A1 | 2/2010 | Winters et al. | |
| 2010/0109166 | A1* | 5/2010 | Cok | H10K 59/131 257/776 |
| 2010/0309100 | A1* | 12/2010 | Cok | G09G 3/3208 345/76 |
| 2014/0168037 | A1* | 6/2014 | Sakariya | G09G 3/32 345/82 |
| 2015/0169011 | A1* | 6/2015 | Bibl | G06F 1/163 345/175 |
| 2016/0210895 | A1* | 7/2016 | Fan | G09G 3/3208 |
| 2018/0182279 | A1* | 6/2018 | Sakariya | G09G 3/2088 |
| 2018/0218668 | A1* | 8/2018 | Aoyagi | G09G 3/32 |
| 2019/0206330 | A1* | 7/2019 | Kim | G09G 3/3233 |
| 2019/0325803 | A1* | 10/2019 | Chen | H01L 25/167 |
| 2020/0020676 | A1* | 1/2020 | Cok | H10W 90/00 |
| 2021/0272510 | A1* | 9/2021 | Huitema | G09G 3/3233 |
| 2021/0329760 | A1* | 10/2021 | Kim | H05B 45/36 |
| 2021/0366391 | A1* | 11/2021 | Wei | G01J 1/44 |
| 2022/0020310 | A1* | 1/2022 | Gray | G09G 3/32 |
| 2022/0172672 | A1* | 6/2022 | Park | G09G 3/32 |
| 2022/0302093 | A1 | 9/2022 | Gu et al. | |
| 2023/0005416 | A1* | 1/2023 | Oh | G09G 5/10 |

FOREIGN PATENT DOCUMENTS

| | | | | |
|---|---|---|---|---|
| CN | 102246304 | A | 11/2011 | |
| CN | 207353247 | U | 5/2018 | |
| CN | 109935612 | A | 6/2019 | |
| CN | 111243496 | A | 6/2020 | |
| CN | 111243497 | A | 6/2020 | |
| CN | 111798804 | A | 10/2020 | |
| CN | 213240691 | U | 5/2021 | |
| CN | 113223443 | A * | 8/2021 | G09G 3/32 |
| CN | 114023248 | A | 2/2022 | |
| EP | 3582262 | A1 | 12/2019 | |
| JP | 2011527023 | A | 10/2011 | |
| JP | 2016508231 | A | 3/2016 | |
| KR | 20110028527 | A | 3/2011 | |
| KR | 20180004247 | A | 1/2018 | |

OTHER PUBLICATIONS

PCT/CN2021/113910 Written Opinion.
Deng, Ming-Yang, et al. "Reducing power consumption of active-matrix mini-LED backlit LCDs by driving circuit." IEEE Transactions on Electron Devices 68.5 (2021): 2347-2354.
"What is AM-miniLED technology? What are the advantages of AM-miniLED panels?" http://www.58display.com/article/zixun/1180.html. Sep. 3, 2018.
JP2023-546315 first office action dated Apr. 8, 2025.
KR10-2023-7026174 first office action dated Feb. 27, 2025.
EP21953839.4 Partial European Search Report dated Apr. 9, 2024.

* cited by examiner

DISPLAY APPARATUSES, DISPLAY PANELS, AND METHODS OF DRIVING DISPLAY PANELS

CROSS-REFERENCE TO RELATED APPLICATIONS

This disclosure is the U.S. national phase of PCT Application No. PCT/CN2021/113910 filed on Aug. 20, 2021, which is incorporated herein by reference in its entirety.

TECHNICAL FIELD

The present disclosure relates to the field of display technology, and in particular to a display apparatus, a display panel, and a method of driving a display panel.

BACKGROUND

With the continuous development of light-emitting diode (LED) technology, mini LEDs are LEDs that are miniaturized to less than 300 microns in size, and thousands, tens of thousands, or even more, of mini LEDs are fixed on a substrate for more detailed local dimming to present a display screen with high contrast and high color expression. Mini LED display apparatuses adopt a passive matrix (PM) driving method, which consumes a large amount of power.

SUMMARY

An objective of the present disclosure is to provide a display apparatus, a display panel, and a method of driving a display panel, which can reduce power consumption.

According to an aspect of the present disclosure, there is provided a display panel, including:

a base substrate;

a pixel array disposed on the base substrate, and including one or more pixel groups each of which includes a plurality of pixels; and a plurality of pixel driving chips disposed on the base substrate and configured to drive the pixel array to display, each of the pixel driving chips including a data signal terminal for receiving data signals and a control signal terminal for receiving control signals, where for each of the pixel groups, the plurality of pixels in the pixel group are connected to a common pixel driving chip.

Further, for each of the pixel groups, multiple pixels of the plurality of pixels are located in different pixel rows in the pixel array.

Further, for each of the pixel groups, multiple pixels of the plurality of pixels are located in different pixel columns in the pixel array.

Further, the plurality of pixels in each of the pixel groups are distributed in a single direction.

Further, the plurality of pixels in each of the pixel groups are located in a same pixel row of the pixel array.

Further, the plurality of pixels in each of the pixel groups are located in a same pixel column of the pixel array.

Further, the plurality of pixel driving chips are arranged in at least one chip column, the chip column being parallel to pixel columns in the pixel array, and located between adjacent two of the pixel columns.

Further, the adjacent two of the pixel columns forms a plurality of pixel groups, the plurality of pixel groups being distributed in an extension direction of the pixel columns, and a plurality of pixel driving chips in the chip column located between the adjacent two of the pixel columns being connected with the plurality of pixel groups in a one-to-one correspondence.

Further, the plurality of pixel driving chips are arranged in a plurality of chip columns, and two of the pixel columns are located between adjacent two of the chip columns.

Further, each of the pixels includes a first sub-pixel, and the display panel further includes:

a plurality of power signal lines, the first sub-pixels in the two pixel columns located between the adjacent two of the chip columns being connected to a common power signal line.

Further, the display panel further includes:

a power signal line connected with the pixels.

Further, each of the pixels includes a sub-pixel including a light-emitting diode, the power signal line is connected with a positive electrode of the light-emitting diode, and the pixel driving chip is connected with a negative electrode of the light-emitting diode.

Further, the display panel further includes:

a data signal line connected with the data signal terminal.

Further, the data signal line includes a plurality of data signal lines, the plurality of pixel driving chips are arranged in at least one chip column, and the plurality of pixel driving chips in the chip column have the data signal terminals connected to a common data signal line.

Further, the display panel further includes:

a control signal line connected with the control signal terminal.

Further, the control signal line includes a plurality of control signal lines, the plurality of pixel driving chips are arranged in at least one chip row, and the plurality of pixel driving chips in the chip row have the control signal terminals connected to a common control signal line.

Further, the display panel further includes:

a data signal line connected with the data signal terminal; and a control chip connected with the control signal line and the data signal line, and configured to provide the control signals to the control signal line and to provide the data signals to the data signal line.

Further, the display panel includes a display area and a peripheral area surrounding the display area, the pixel driving chips being located in the display area and the control chip being located in the peripheral area.

Further, each of the pixel driving chips further includes at least one of a supply voltage terminal or a ground terminal.

Further, the pixel array includes a plurality of pixel rows and a plurality of pixel columns, a number of the pixel rows is an even number, and a number of the pixel columns is an even number.

Further, the plurality of pixel driving chips are arranged in an array.

According to an aspect of the present disclosure, there is provided a display apparatus including the above display panel.

According to an aspect of the present disclosure, there is provided a method of driving the above display panel, a display frame of which includes an address assignment stage and a data signal transmission stage, the method including:

inputting the control signal to the control signal terminal and inputting a first data signal to the data signal terminal in the address assignment stage; and inputting a second data signal to the data signal terminal in the data signal transmission stage.

With the display apparatus, the display panel, and the method of driving the display panel according to the present disclosure, during the driving process, the control signal is input to the control signal terminal of the pixel driving chip, the first data signal is input to the data signal terminal of the pixel driving chip, and the second data signal is input to the data signal terminal of the pixel driving chip, such that each pixel driving chip provides the data signals to the corresponding pixel, enabling an active matrix (AM) driving method. Moreover, since the plurality of pixels in the pixel group are connected to the common pixel driving chip, the number of signal lines on the base substrate is reduced to lower the process difficulty, and the power consumption and cost of driving the overall display module are reduced, which greatly improves competitive advantages of products.

DESCRIPTION OF REFERENCE SIGNS

Figure 1:
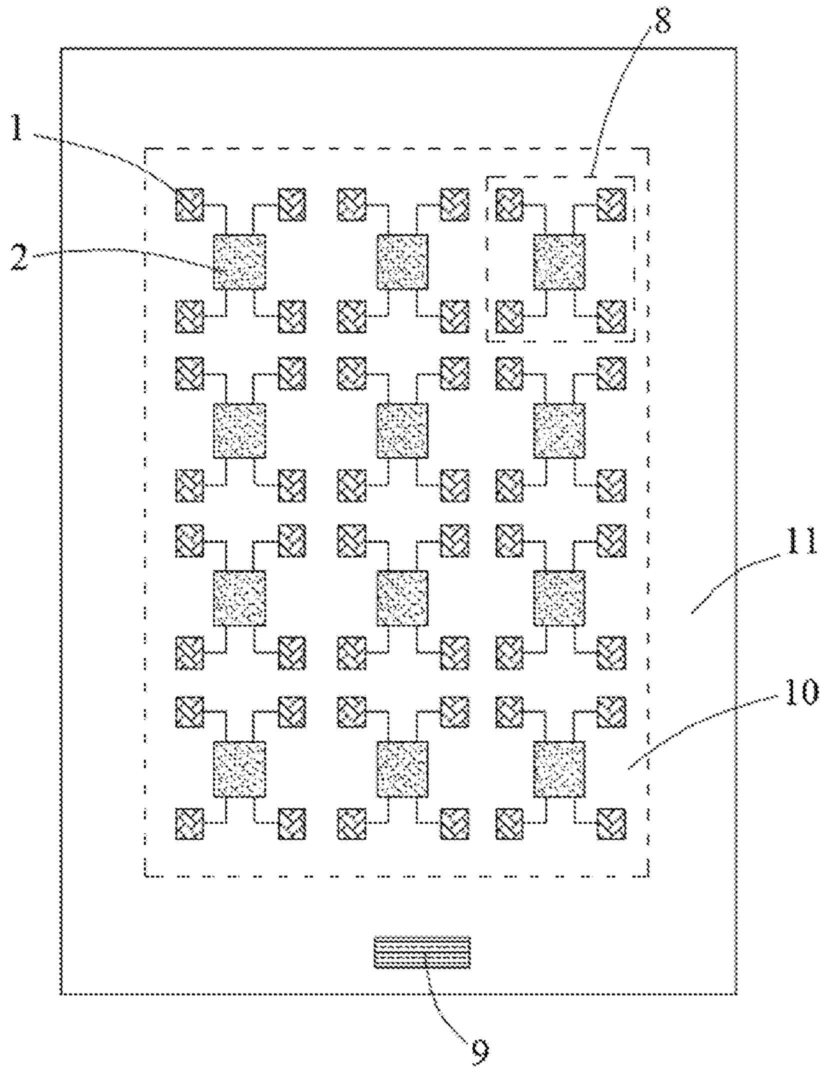
FIG. 1 is a schematic diagram illustrating a display panel according to an embodiment of the present disclosure.

1: pixel; 101: first sub-pixel; 102: second sub-pixel; 103: third sub-pixel; 2: pixel driving chip; 3: control signal terminal; 4: data signal terminal; 5: supply voltage terminal; 6: ground terminal; 7: signal channel terminal; 8: pixel group; 9: control chip; 10: display area; 11: peripheral area; 100: pixel column; 200: chip column; 300: pixel row; 400: chip row.

DETAILED DESCRIPTION

Exemplary embodiments will be described herein in detail, examples of which are illustrated in the drawings. When the following description involves the drawings, like numerals in different drawings refer to like or similar elements unless otherwise indicated. Embodiments described in the following exemplary embodiments do not represent all embodiments consistent with the present disclosure. Rather, they are merely examples of apparatuses consistent with some aspects of the present disclosure as detailed in the appended claims.

Terminology used in the present disclosure is for the purpose of describing particular embodiments only, and is not intended to limit the present disclosure. Unless otherwise defined, technical or scientific terms used in the present disclosure should have ordinary meanings as understood by those ordinary skilled in the art to which the present disclosure belongs. Words "first", "second", and the like, as used in the specification and claims of the present disclosure, do not indicate any sequence, quantity or importance, but are only used to distinguish between different components. Likewise, words "a" or "an" and the like do not indicate any quantity limitation, but rather indicate the presence of at least one. Word "a plurality of" or "several" indicates two or more. Unless otherwise indicated, words such as "front", "rear", "lower" and/or "upper" are for illustrative purposes only, and are not limited to a position or a spatial orientation. Words "include" or "comprise" and the like are intended to refer to that an element or object appearing before "include" or "comprise" covers an element or object listed after "include" or "comprise" and its equivalents, and do not exclude other elements or objects. Words "connect" or "couple" and the like are not limited to a physical or mechanical connection, but may include an electrical connection, whether direct or indirect. As used in the specification and the appended claims of the present disclosure, terms determined by "a", "the" and "said" in their singular forms are intended to include plural forms as well, unless clearly indicated otherwise in the context. It should also be understood that the term "and/or" as used herein refers to and includes any or all possible combinations of one or more of the associated listed items.

Embodiments of the present disclosure provide a display panel. As shown in FIGS. 1 to 4, the display panel may include a base substrate, a pixel array, and a pixel driving chip 2.

The pixel array is disposed on the base substrate. The pixel array includes one or more pixel groups 8. Each pixel group 8 includes a plurality of pixels 1. The pixel driving chip 2 may be provided in plural. A plurality of pixel driving chips 2 are disposed on the base substrate, and are configured to drive the pixel array to display. The pixel driving chip 2 includes a data signal terminal 4 for receiving data signals and a control signal terminal 3 for receiving control signals. The plurality of pixels 1 in the pixel group 8 are connected to a common pixel driving chip 2.

With the display panel according to the embodiments of the present disclosure, during the driving process, the control signal is input to the control signal terminal 3 of the pixel driving chip 2, the first data signal is input to the data signal terminal 4 of the pixel driving chip 2, and the second data signal is input to the data signal terminal 4 of the pixel driving chip 2, such that each pixel driving chip 2 provides the data signals to the corresponding pixel 1, enabling an active matrix (AM) driving method. Moreover, since the plurality of pixels 1 in the pixel group 8 are connected to the common pixel driving chip 2, the number of signal lines on the base substrate is reduced to lower the process difficulty, and the power consumption and cost of driving the overall display module are reduced, which greatly improves competitive advantages of products.

Components of the display panel according to the embodiments of the present disclosure will be described in detail below.

The base substrate may be a rigid base substrate made of, for example, glass, quartz, PMMA (polymethyl methacrylate), plastic, or the like, which is not particularly limited in the embodiments of the present disclosure.

Figure 3:
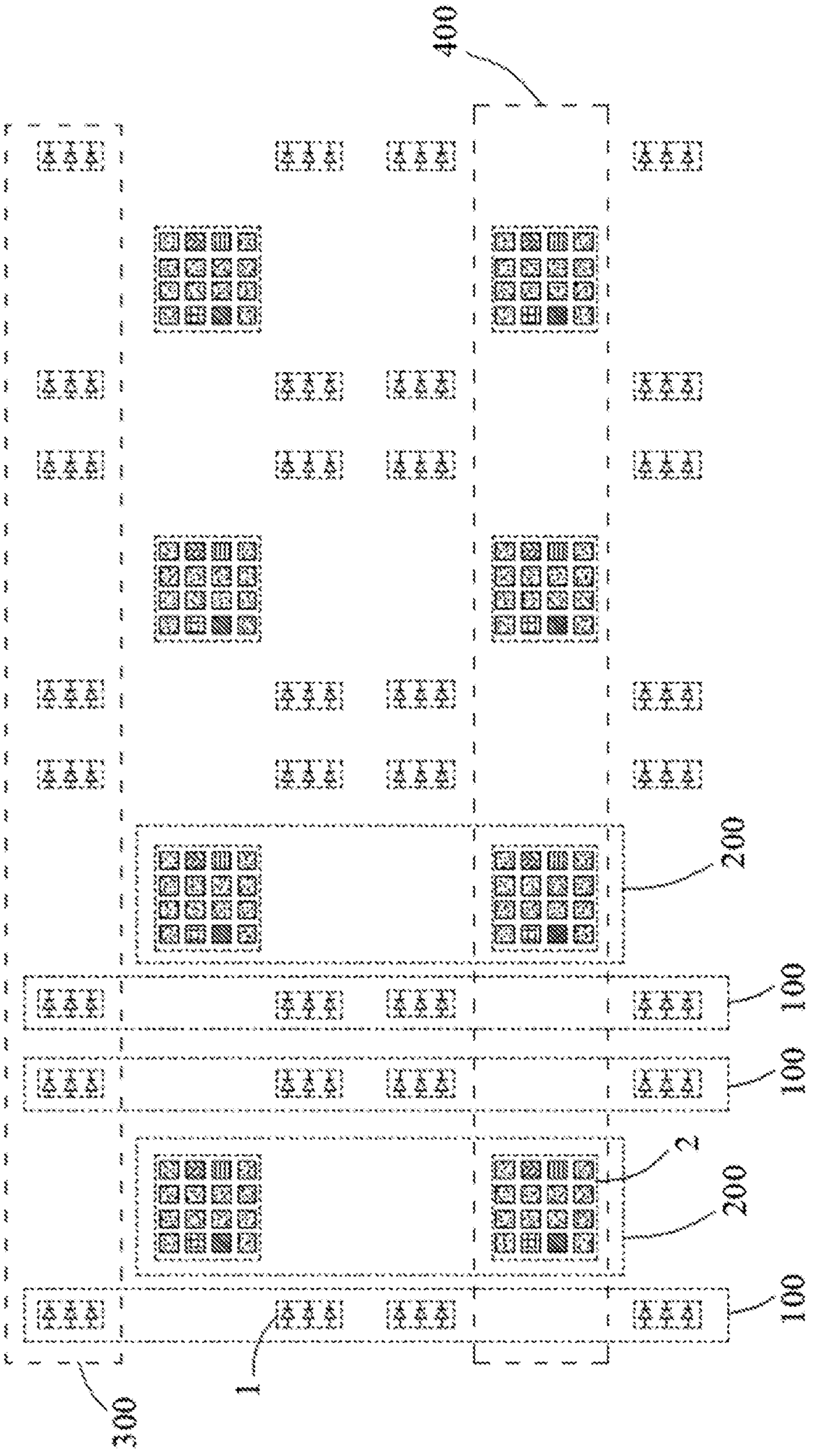
FIG. 3 is a schematic diagram illustrating a distribution of a pixel array and pixel driving chips in FIG. 2.
Figure 4:
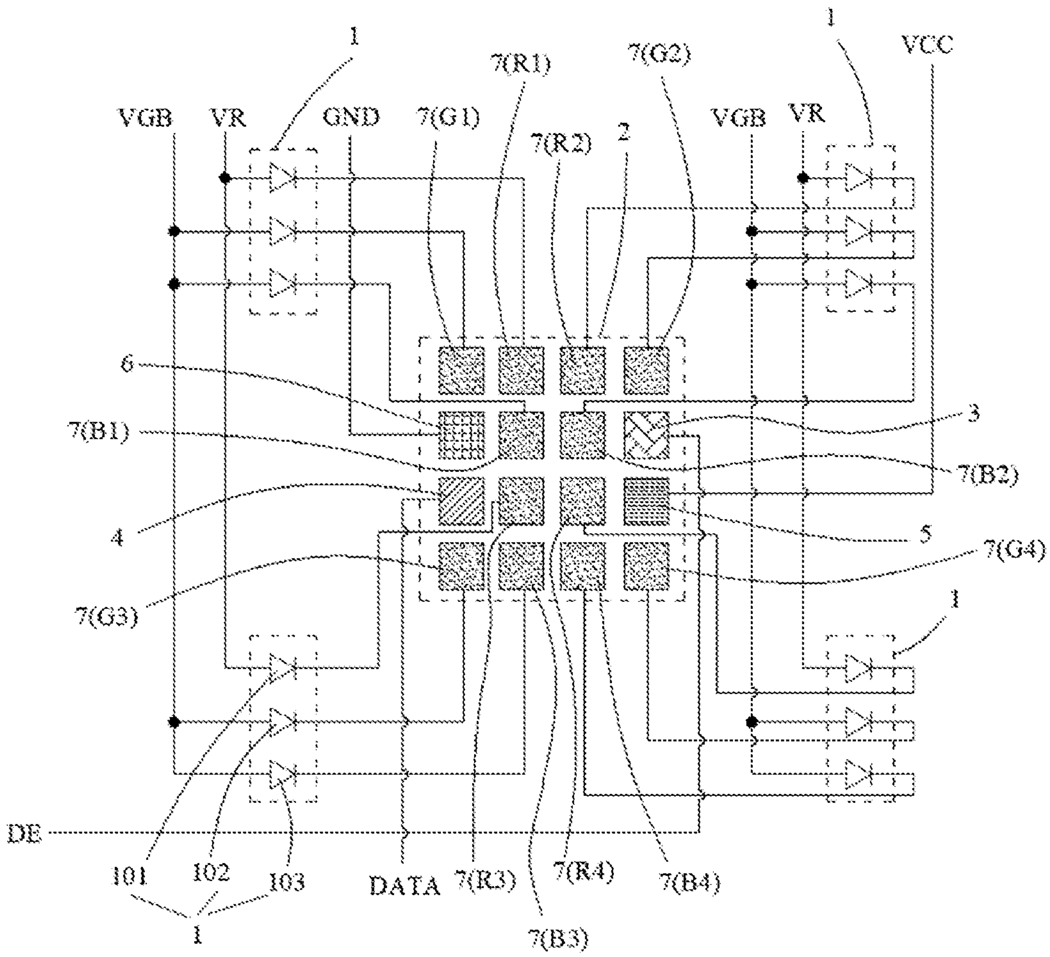
FIG. 4 is a schematic diagram illustrating pixel groups and pixel driving chips in FIG. 2.

The pixel array is disposed on the base substrate. As shown in FIG. 1, the display panel may include a display area 10 and a peripheral area 11 surrounding the display area 10. The pixel array may be located in the display area 10 of the display panel. As shown in FIG. 3, the pixel array may include a plurality of pixel rows 300 and a plurality of pixel columns 100. The pixel row 300 may extend in a first direction, and the pixel column 100 may extend in a second direction. The first direction may be perpendicular to the second direction. The number of the pixel rows 300 may be an even number, but the present disclosure is not limited thereto, and the number of the pixel rows 300 may be an odd number. The number of the pixel columns 100 may also be an even number, but the present disclosure is not limited thereto, and the number of the pixel columns 100 may be an odd number. The pixel row 300 may include a plurality of pixels 1. The pixel column 100 may include a plurality of pixels 1. As shown in FIG. 4, the pixel 1 may include a plurality of sub-pixels. The plurality of sub-pixels may emit light with different colors; however, the plurality of sub-pixels may emit light with the same color. In particular, the plurality of sub-pixels may include a first sub-pixel 101, a second sub-pixel 102, and a third sub-pixel 103. The first sub-pixel 101 may be a red sub-pixel; however, the first sub-pixel 101 may be a blue sub-pixel, but the present disclosure is not limited thereto, and the first sub-pixel 101 may also be a green sub-pixel. The second sub-pixel 102 may be a red sub-pixel; however, the second sub-pixel 102 may be a blue sub-pixel, but the present disclosure is not limited thereto, and the second sub-pixel 102 may also be a green sub-pixel. The third sub-pixel 103 may be a red sub-pixel; however, the third sub-pixel 103 may be a blue sub-pixel, but the present disclosure is not limited thereto, and the third sub-pixel 103 may also be a green sub-pixel. For example, in the case that the plurality of sub-pixels emit light with different colors, the first sub-pixel 101 is a red sub-pixel for emitting red light, the second sub-pixel 102 is a blue sub-pixel for emitting blue light, and the third sub-pixel 103 is a green sub-pixel for emitting green light. Each sub-pixel may include one or more light-emitting diodes. The light-emitting diode may be a Mini LED; however, the light-emitting diode may be a Micro LED, but the embodiments of the present disclosure are not limited thereto. For example, in the case that the sub-pixel includes two light-emitting diodes, the two light-emitting diodes are connected in parallel and have the same luminous color. In addition, an orthographic projection of the light-emitting diode on the base substrate may be a quadrilateral with a width of 70 μm to 100 μm and a length of 120 μm to 180 μm. The light-emitting diode is a stand-alone component, which may be provided on the base substrate by a surface mount technology (SMT) or a mass transfer technology.

As shown in FIG. 1, the pixel array may include one pixel group 8; however, the pixel array may also include a plurality of pixel groups 8, that is, a plurality of pixels 1 in the pixel array may be divided into a plurality of pixel groups 8. Among the plurality of pixel groups 8, at least one pixel group 8 includes a plurality of pixels 1. For example, in the case of a plurality of pixel groups 8, the plurality of pixel groups 8 may have the same number of pixels 1; however, two of the plurality of pixel groups 8 may have different numbers of pixels 1.

Figure 6:
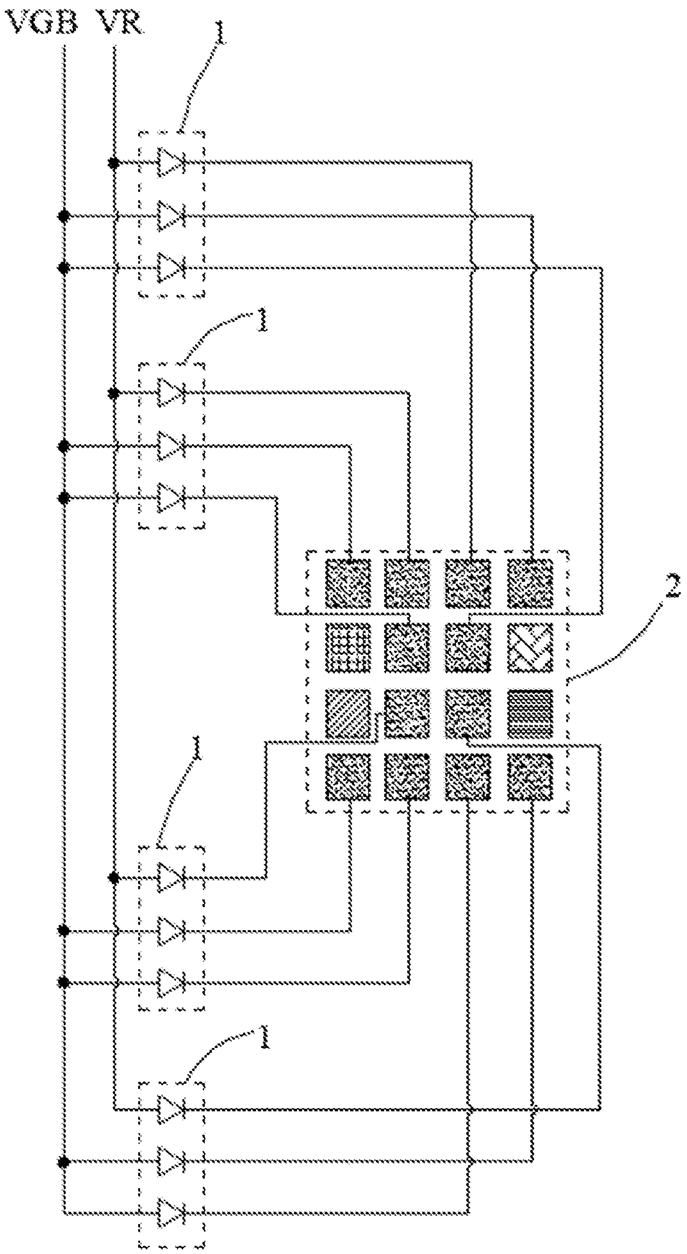
FIG. 6 is a schematic diagram illustrating pixel groups and pixel driving chips in a display panel according to yet another embodiment of the present disclosure.

Multiple pixels 1 of the plurality of pixels 1 in the pixel group 8 may be located in different pixel rows 300 in the pixel array, that is, at least two pixels 1 of the plurality of pixels 1 in the pixel group 8 may be located in different pixel rows 300 in the pixel array. The different pixel rows 300 may be sequentially arranged, which is not particularly limited in the embodiments of the present disclosure. For example, in the case that four pixels 1 are included in the pixel group 8, two of the four pixels 1 are located in different pixel rows 300, where one of the two pixels 1 is located in the nth pixel row 300 and the other is located in the (n+1)th pixel row 300, n being an integer greater than or equal to 1, and the nth pixel row 300 and the (n+1)th pixel row 300 are sequentially arranged. However, among the four pixels 1, three pixels 1 may be located in different pixel rows 300, where one of the three pixels 1 is located in the nth pixel row 300, another one is located in the (n+1)th pixel row 300, and the remaining one is located in the (n+2)th pixel row 300. Further, as shown in FIG. 6, all of the four pixels 1 are located in different pixel rows 300; for example, the four pixels 1 are located in the same pixel column 100.

Figure 5:
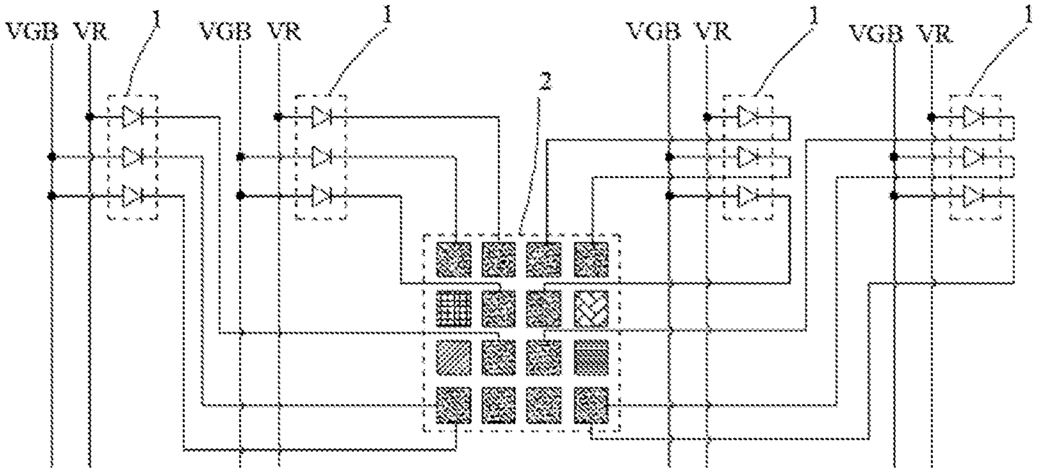
FIG. 5 is a schematic diagram illustrating pixel groups and pixel driving chips in a display panel according to another embodiment of the present disclosure.

However, multiple pixels 1 of the plurality of pixels 1 in the pixel group 8 may be located in different pixel columns 100 in the pixel array, that is, at least two pixels 1 of the plurality of pixels 1 in the pixel group 8 may be located in different pixel columns 100 in the pixel array. The different pixel columns 100 may be sequentially arranged, which is not particularly limited in the embodiments of the present disclosure. For example, in the case that four pixels 1 are included in the pixel group 8, two of the four pixels 1 are located in different pixel columns 100, where one of the two pixels 1 is located in the mth pixel column 100 and the other is located in the (m+1)th pixel column 100, m being an integer greater than or equal to 1, and the mth pixel column 100 and the (m+1)th pixel column 100 are sequentially arranged. However, among the four pixels 1, three pixels 1 may be located in different pixel columns 100, where one of the three pixels 1 is located in the mth pixel column 100, another one is located in the (m+1)th pixel column 100, and the remaining one is located in the (m+2)th pixel column 100. Further, as shown in FIG. 5, all of the four pixels 1 are located in different pixel column 100; for example, the four pixels 1 are located in the same pixel row 300.

The plurality of pixels 1 in the pixel group 8 may be distributed in the same direction. In an embodiment of the present disclosure, as shown in FIG. 5, the plurality of pixels 1 in the pixel group 8 may be located in the same pixel row 300 in the pixel array, and the plurality of pixels 1 in the same pixel row 300 are sequentially arranged. For the sake of description, the four pixels 1 in FIG. 5 are sequentially numbered from left to right, and a distance between the second pixel 1 and the third pixel 1 closest to the pixel driving chip 2 is slightly greater than that between the first pixel 1 and the second pixel 1 and that between the third pixel 1 and the fourth pixel 1. However, in an actual layout design, any two pixels 1 may be equally spaced in a row direction, which is not limited in the embodiments of the present disclosure as long as the pixel driving chip 2 does not affect a display effect of all the pixels 1 in an actual design. In another embodiment of the present disclosure, as shown in FIG. 6, the plurality of pixels 1 in the pixel group 8 may be located in the same pixel column 100 in the pixel array, and the plurality of pixels 1 in the same pixel column 100 are sequentially arranged. For the sake of description, the four pixels 1 in FIG. 6 are sequentially numbered from top to bottom, and a distance between the second pixel 1 and the third pixel 1 closest to the pixel driving chip 2 is slightly greater than that between the first pixel 1 and the second pixel 1 and that between the third pixel 1 and the fourth pixel 1. However, in an actual layout design, any two pixels 1 may be equally spaced in a column direction, which is not limited in the embodiments of the present disclosure as long as the pixel driving chip 2 does not affect a display effect of all the pixels 1 in an actual design.

As shown in FIG. 4, the pixel driving chip 2 is disposed on the base substrate. The pixel driving chip 2 and the pixel 1 may be disposed on the same side of the base substrate; however, the pixel driving chip 2 and the pixel 1 may be disposed on opposite sides of the base substrate. The pixel driving chip 2 is connected with the pixel 1. The pixel driving chip 2 may be connected with the plurality of sub-pixels in the pixel 1. In particular, the pixel driving chip 2 has signal terminals which may include a plurality of signal channel terminals 7, and the plurality of signal channel terminals 7 of the pixel driving chip 2 are connected with the plurality of sub-pixels in the pixels 1 in the pixel group 8 in a one-to-one correspondence. For example, in the case that the sub-pixel includes a light-emitting diode, the signal channel terminal 7 may be connected with a first electrode of the light-emitting diode. The first electrode may be a negative electrode; however, the first electrode may be a positive electrode. The signal terminals of the pixel driving chip 2 include the data signal terminal 4 and the control signal terminal 3. The data signal terminal 4 is configured to receive data signals, and the control signal terminal 3 is configured to receive control signals. The data signals may include a first data signal and a second data signal. In addition, the signal terminals of the pixel driving chip 2 may further include a supply voltage terminal 5 and/or a ground terminal 6. For example, in the case that the number of the signal terminals of the pixel driving chip 2 is X, the maximum number of the signal terminals in the row direction is a, and the maximum number of the signal terminals in the column direction is b, where a, b, and X are all integers, and the product of a and b is less than or equal to X. It should be noted that, for the pixel driving chip 2 according to the present disclosure, an absolute value of a difference between a and b is minimum. This can prevent the pixel driving chip 2 from being too large in size in a single direction, and solve the resulting problem that the plurality of pixels 1 are spaced too far apart in the single direction. For example, in the case that the number of the signal terminals of the pixel driving chip 2 is 16, the number of the signal terminals in the row direction and the number of the signal terminals in the column direction are both 4.

An orthographic projection of the pixel driving chip 2 on the base substrate may be a quadrilateral with a width of 350 μm to 450 μm and a length of 350 μm to 450 μm. The orthographic projection of the pixel driving chip 2 on the base substrate may have the same length and width, which is not particularly limited in the present disclosure. An area of the orthographic projection of the pixel driving chip 2 on the base substrate may be 8 times to 15 times an area of the orthographic projection of the light-emitting diode in the pixel 1 on the base substrate. The pixel driving chip 2 is a stand-alone component, which may be assembled on the base substrate by the surface mount technology (SMT). The base substrate is provided with a pad, and the signal terminal of the pixel driving chip 2 is fixedly connected with the pad during the assembly of the pixel driving chip 2 on the base substrate by the surface mount technology.

The pixel driving chip 2 may be provided in plural, and a plurality of pixel driving chips 2 work together to drive the pixel array to display. In particular, as shown in FIG. 1 and FIG. 4, the plurality of pixels 1 in the pixel group 8 are connected to the common pixel driving chip 2, that is, the plurality of sub-pixels in each of the plurality of pixels 1 are connected to the common pixel driving chip 2. For example, in the case that the pixel group 8 includes four pixels 1 and each pixel 1 includes three sub-pixels, the three sub-pixels in each of the four pixels 1 are connected to the common pixel driving chip 2, that is, the pixel driving chip 2 is connected with twelve sub-pixels. The pixel driving chip 2 may include twelve signal channel terminals 7, which are connected with the first electrodes of the light-emitting diodes of the respective sub-pixels in a one-to-one correspondence. For example, in the case of a plurality of pixel groups 8, the plurality of pixel driving chips 2 are configured to drive the plurality of pixel groups 8 to display in a one-to-one correspondence.

As shown in FIG. 3, the plurality of pixel driving chips 2 according to the present disclosure may be arranged in an array to form a plurality of chip columns 200 and a plurality of chip rows 400. The chip row 400 may be parallel to the pixel row 300 described above. The chip column 200 may be parallel to the pixel column 100 described above. The number of the pixel driving chips 2 in the chip column 200 may be less than or equal to the number of the pixels 1 in the pixel column 100. Among the plurality of chip columns 200, at least one chip column 200 is located between two adjacent pixel columns 100, and the chip column 200 located between the two adjacent pixel columns 100 is configured to drive the two adjacent pixel columns 100 to display. There is only one chip column 200 between the two adjacent pixel columns 100. The two adjacent pixel columns 100 may form a plurality of pixel groups 8, the number of the pixels 1 included in each pixel group 8 may be the same or different, and the plurality of pixel groups 8 are distributed in an extension direction of the pixel column 100. For example, in the case that each pixel column 100 includes six rows of pixels 1 and each pixel group 8 includes four pixels 1, for the two adjacent pixel columns 100, two pixels 1 in the first row and two pixels 1 in the second row may form one pixel group 8, two pixels 1 in the third row and two pixels 1 in the fourth row may form another pixel group 8, and two pixels 1 in the fifth row and two pixels 1 in the sixth row may form yet another pixel group 8. In addition, the plurality of pixel driving chips 2 in the chip column 200 located between the two adjacent pixel columns 100 are connected with the plurality of pixel groups 8 in a one-to-one correspondence.

However, the plurality of pixel driving chips 2 according to the present disclosure may not be arranged in an array, and the number of signal lines on the base substrate may be reduced as long as one pixel driving chip 2 is connected with the plurality of pixels 1 in the pixel group 8. In an embodiment, the plurality of pixel driving chips 2 form a plurality of chip rows 400, but do not form any chip columns 200, and each chip row 400 may have the same number of the pixel driving chips 2. In another embodiment, the plurality of pixel driving chips 2 form a plurality of chip columns 200, but do not form any chip rows 400, and each chip column 200 may have the same number of the pixel driving chips 2.

Figure 2:
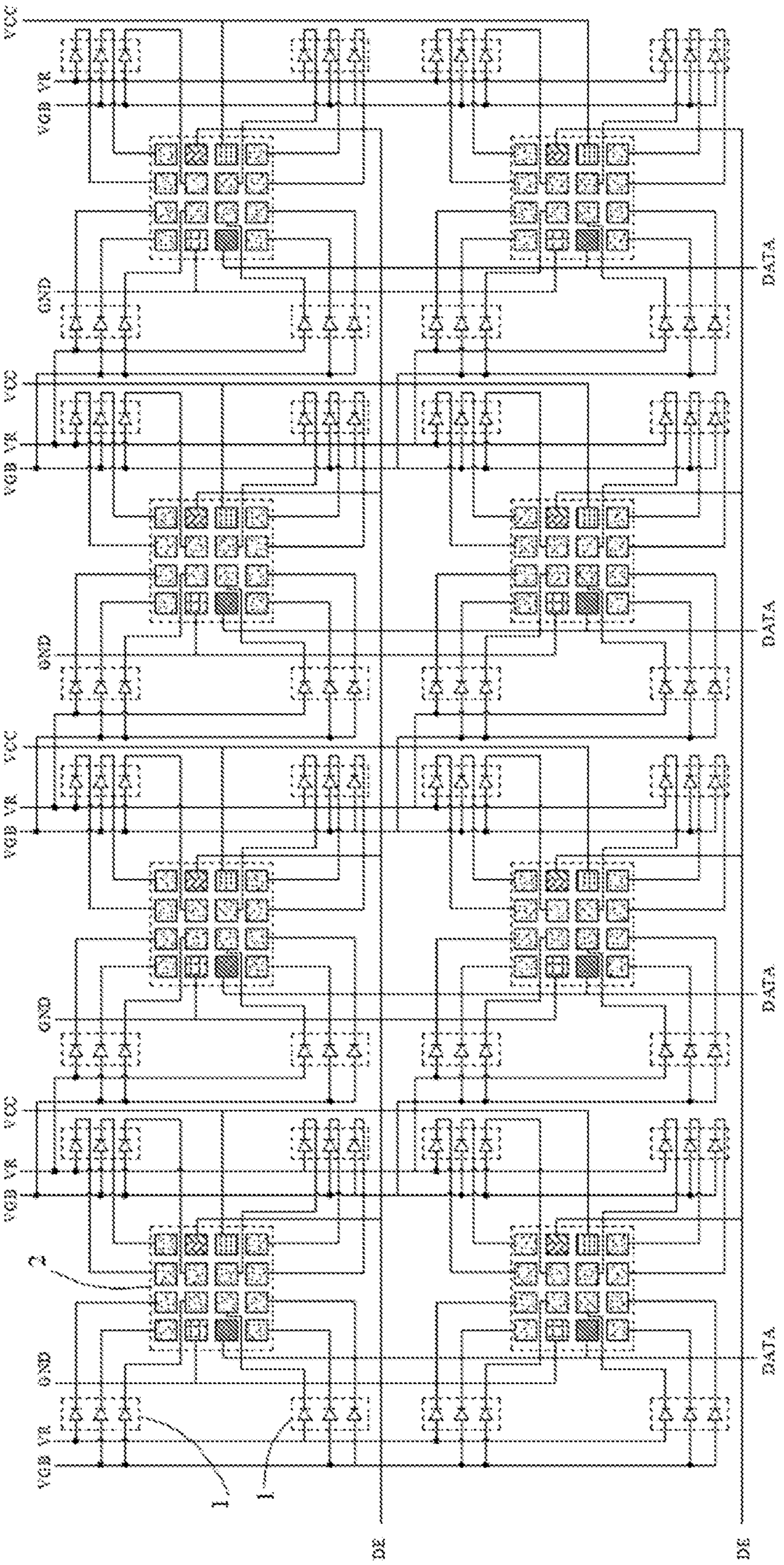
FIG. 2 is a schematic diagram illustrating a display area in FIG. 1.

As shown in FIG. 1, FIG. 2, and FIG. 3, the display panel according to the embodiments of the present disclosure further includes a plurality of power signal lines. The power signal line may be arranged in parallel with the pixel column 100. The power signal line is connected with the pixel 1. The power signal line is connected with the sub-pixel in the pixel 1. In particular, the power signal line is connected with a second electrode of the light-emitting diode of the sub-pixel. For example, in the case that the first electrode of the light-emitting diode is the negative electrode, the second electrode may be the positive electrode; and in the case that the first electrode of the light-emitting diode is the positive electrode, the second electrode may be the negative electrode. For two pixel columns 100 located between two adjacent chip columns 200, the first sub-pixels 101 in the two pixel columns 100 are connected to a common power signal line, thereby reducing the number of the power signal lines. In addition, as shown in FIGS. 1 and 4, the power signal line may include a first power signal line VR and a second power signal line VGB. The red sub-pixel in each pixel 1 may be connected with the first power signal line VR, and the green sub-pixel and the blue sub-pixel in each pixel 1 are both connected with the second power signal line VGB.

As shown in FIG. 3, the (2k−1)th chip column 200 is provided between the (4k−3)th pixel column 100 and the (4k−2)th pixel column 100, no chip column 200 is provided between the (4k−2)th pixel column 100 and the (4k−1)th pixel column 100, the (2k)th chip column 200 is provided between the (4k−1)th pixel column 100 and the (4k)th pixel column 100, and the (4k−2)th pixel column 100 and the (4k−1)th pixel column 100 are provided between the (2k−1)th chip column 200 and the (2k)th chip column 200, where the (2k−1)th chip column 200 is configured to drive the (4k−3)th pixel column 100 and the (4k−2)th pixel column 100 to display, the (2k)th chip column 200 is configured to drive the (4k−1)th pixel column 100 and the (4k)th pixel column 100 to display, and the first sub-pixels 101 in the (4k−2)th pixel column 100 and the first sub-pixels 101 in the (4k−1)th pixel column 100 may share the power signal line, k being a positive integer. In addition, a distance between the (4k−3)th pixel column 100 and the (4k−2)th pixel column 100 may be greater than a distance between the (4k−2)th pixel column 100 and the (4k−1)th pixel column 100, and a distance between the (4k−1)th pixel column 100 and the (4k)th pixel column 100 may also be greater than the distance between the (4k−2)th pixel column 100 and the (4k−1)th pixel column 100.

That is to say, the pixel driving chip 2 is provided between a part of the pixel rows 300 adjacent to each other, while no pixel driving chip 2 is provided between another part of the pixel rows 300 adjacent to each other. A distance between two adjacent pixel rows 300 with the pixel driving chip 2 provided therebetween is greater than a distance between two adjacent pixel rows 300 with no pixel driving chip 2 provided therebetween. The pixel driving chip 2 is provided between a part of the pixel columns 100 adjacent to each other, while no pixel driving chip 2 is provided between another part of the pixel columns 100 adjacent to each other. A distance between two adjacent pixel columns 100 with the pixel driving chip 2 provided therebetween is greater than a distance between two adjacent pixel columns 100 with no pixel driving chip 2 provided therebetween. However, in the actual layout design, any two adjacent pixel rows 300 may be equally spaced in the column direction, and any two adjacent pixel columns 100 may be equally spaced in the row direction, which is not limited in the embodiments of the present disclosure as long as the pixel driving chip 2 does not affect the display effect of all the pixels 1 in the actual design.

As shown in FIG. 1, FIG. 2, and FIG. 3, the display panel according to the embodiments of the present disclosure may further include a plurality of data signal lines DATA. The data signal line DATA may be arranged in parallel with the pixel column 100. The data signal line DATA may be connected with the data signal terminal 4 of the pixel driving chip 2. The data signal terminals 4 of the respective pixel driving chips 2 in the chip column 200 may be connected to a common data signal line DATA, which is not particularly limited in the embodiments of the present disclosure. The display panel according to the embodiments of the present disclosure may further include a plurality of control signal lines DE. The control signal line DE may be arranged in parallel with the pixel row 300 in the pixel array. The control signal line DE may be connected with the control signal terminal 3 of the pixel driving chip 2. The control signal terminals 3 of the respective pixel driving chips 2 in the chip row 400 may be connected to a common control signal line DE, which is not particularly limited in the embodiments of the present disclosure. As shown in FIG. 1, the display panel according to the embodiments of the present disclosure may further include a control chip 9. The control chip 9 may be connected with the control signal line DE and the data signal line DATA, to provide the control signals to the control signal line DE and to provide the data signals to the data signal line DATA. The control chip 9 may be located in the peripheral area 11 of the display panel.

As shown in FIG. 1, FIG. 2, and FIG. 3, the display panel according to the embodiments of the present disclosure may further include a plurality of supply voltage lines VCC. The supply voltage line VCC may be arranged in parallel with the pixel column 100. The supply voltage line VCC may be connected with the supply voltage terminal 5 of the pixel driving chip 2. The supply voltage terminals 5 of the respective pixel driving chips 2 in the chip column 200 may be connected to a common supply voltage line VCC, which is not particularly limited in the embodiments of the present disclosure. The display panel according to the embodiments of the present disclosure may further include a plurality of ground lines GND. The ground line GND may be arranged in parallel with the pixel column 100. The ground line GND may be connected with the ground terminal 6 of the pixel driving chip 2. The ground terminals 6 of the respective pixel driving chips 2 in the chip column 200 may be connected to a common ground line GND, which is not particularly limited in the embodiments of the present disclosure. The supply voltage terminal 5 according to the present disclosure is configured to receive a power supply voltage, and the control signal terminal 3 is configured to receive the control signals. By receiving the power supply voltage and the control signals separately through two signal ports, it is possible to prevent the pixel driving chip 2 from operating in an abnormal state due to incorrect reading of the control signals by the pixel driving chip 2, and prevent the display effect from being affected.

It should be noted that signal lines such as the first power signal line VR, the second power signal line VGB, the control signal line DE, the data signal line DATA, the ground line GND, and the supply voltage line VCC according to the present disclosure may be directly formed on the base substrate, and may be prepared, for example, through processes such as film forming and patterning. In the present disclosure, the pixel driving chip 2 may be assembled on the base substrate after the signal lines are formed through processes such as film forming and patterning. An orthographic projection of the pixel driving chip 2 on the base substrate overlaps with an orthographic projection of part of the signal lines on the base substrate, which can maximize the rational use of wiring space and increase the pixel arrangement density.

Figure 7:
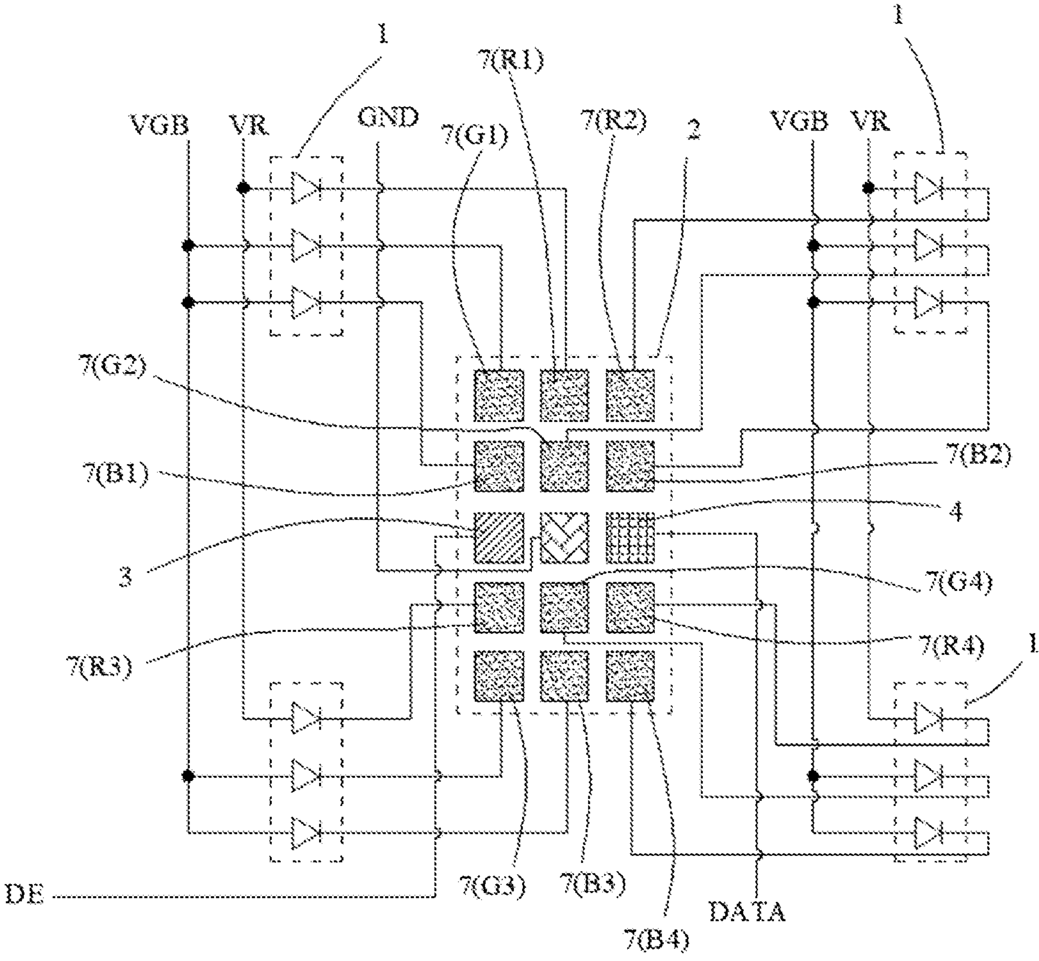
FIG. 7 is a schematic diagram illustrating a connection of a pixel driving chip without a supply voltage terminal according to an embodiment of the present disclosure.

In other embodiments of the present disclosure, as shown in FIG. 7, the power supply voltage and an address signal may be input from a common signal terminal of the pixel driving chip 2, for example, from the control signal terminal 3. By way of example, in the present disclosure, a control function and a power supply function may be distinguished from each other by amplitude of a signal received at the control signal terminal 3. For example, the control function is performed when the amplitude of the signal is higher than a preset level, and the power supply function is performed when the amplitude of the signal is lower than a preset level.

Taking a display panel with a resolution of 160*180 as an example, the display panel needs 80 data signal lines DATA, 90 control signal lines DE, and 80 ground lines GND, when the pixel driving chip 2 is connected with the pixel 1 according to the structure shown in FIG. 4. Compared to a driving scheme in which a single pixel 1 is driven by a single pixel driving chip 2, the embodiments of the present disclosure can reduce the number of lines by half. Two pixel columns 100 located between two adjacent chip columns 200 may share the first power signal line VR and the second power signal line VGB, that is, as for the display panel in FIG. 1, the pixel columns 100 on the left and right sides do not share the first power signal line VR and the second power signal line VGB with other pixel columns 100, and the pixel columns 100 located between the pixel columns 100 on the left and right sides may share the first power signal line VR and the second power signal line VGB, such that the number of the first power signal lines VR is 81 and the number of the second power signal lines VGB is 81, which greatly reduces the number of lines on the display panel, reduces the production cost, and greatly improves competitive advantages of products.

Taking a display panel with a resolution of 160*180 as an example, the display panel needs 40 data signal lines DATA, 180 control signal lines DE, 40 ground lines GND, and 40 supply voltage lines VCC, when the pixel driving chip 2 is connected with the pixel 1 according to the structure shown in FIG. 5. The number of the first power signal lines VR is 160, and the number of the second power signal lines VGB is 160.

Taking a display panel with a resolution of 160*180 as an example, the display panel needs 160 data signal lines DATA, 45 control signal lines DE, 160 ground lines GND, and 160 supply voltage lines VCC, when the pixel driving chip 2 is connected with the pixel 1 according to the structure shown in FIG. 6. The number of the first power signal lines VR is 160, and the number of the second power signal lines VGB is 160.

Embodiments of the present disclosure further provide a display apparatus. The display apparatus may include the display panel according to any one of the above embodiments. The display apparatus may be applied to any product or component with a display function, such as a mobile phone, a tablet computer, a TV set, a display, a notebook computer, a digital photo frame, and a navigator. Since the display panel included in the display apparatus is the same as the display panel in the above embodiments of the display panel, it has the same beneficial effects, which will not be repeated herein.

Figure 8:
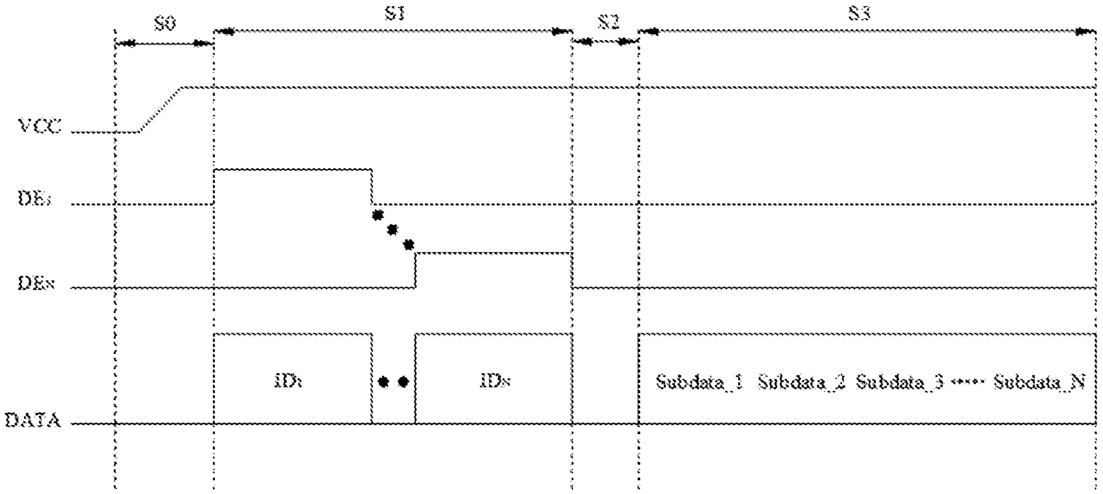
FIG. 8 is a sequence diagram corresponding to a method of driving a display panel according to an embodiment of the present disclosure.

Embodiments of the present disclosure further provide a method of driving a display panel. The display panel may be the display panel according to any one of the above embodiments. As an example, each pixel driving chip 2 in the display panel is configured to drive one pixel group 8, and each pixel group 8 includes four pixels 1. In this case, 4M*N pixels 1, and pixel driving chips 2 in N rows and M columns are arranged in an array on the display panel, where M and N are both positive integers. When the display panel is displaying, a frame of the display panel may include an address assignment stage and a data signal transmission stage. As shown in FIG. 8, the method of driving the display panel may include stage S1 and stage S3.

In the stage S1, an address is assigned to each pixel driving chip 2.

As an example, the control signal terminals 3 of the pixel driving chips 2 in the same chip row 400 are connected with a single control signal line DE, and the data signal terminals 4 of the pixel driving chips 2 in the same chip column 200 are connected with a single data signal line DATA. As shown in FIG. 8, in the stage S1, the control chip 9 inputs the first data signals to the plurality of chip columns 200 through the plurality of data signal lines DATA, and the control chip 9 sequentially inputs the control signals to the plurality of chip rows 400 row by row through the plurality of control signal lines DE, so as to control the data signal terminals 4 of the pixel driving chips 2 located in the same chip row 400 to receive the first data signals transmitted from different data signal lines at the same time. In particular, the display panel includes N chip rows 400 and N control signal lines. As shown in FIG. 8, when the first control signal line $DE_1$ transmits the control signal, the pixel driving chips 2 in the first chip row 400 are triggered and the remaining chip rows 400 are not triggered, and the respective data signal lines DATA transmit different first data signals to the pixel driving chips 2 in different chip columns 200 in the first chip row 400 at the same time, and the pixel driving chips 2 in each column in the first chip row 400 receive the first data signals. When the control chip 9 transmits the control signal through the Nth control signal line $DE_N$, the pixel driving chips 2 in the Nth chip row 400 are triggered and the remaining chip rows 400 are not triggered, and the respective data signal lines DATA transmit different first data signals to the pixel driving chips 2 in different chip columns 200 in the Nth chip row 400 at the same time, and the pixel driving chips 2 in each column in the Nth chip row 400 receive the first data signals. The first data signal may be a digital signal, which may include a start command SoT, address information ID, an interval command DCX, and an end command EoT that are set in sequence. Since the first data signal involves the address information ID, the address information ID may be set for the pixel driving chip 2. A length of the first data signal may be set to 12 bits, with 1 bit set for the start command SoT, 8 bits set for the address information ID, 1 bit set for the interval command DCX, and 2 bits set for the end command EoT. After receiving the first data signal, each pixel driving chip 2 stores the address information ID therein inside the pixel driving chip 2.

It may be understood that prior to the stage S1, the pixel driving chip 2 in the present disclosure may be in a sleep state, which is a low-power operating mode or a non-operating state. The power supply voltage is input to the supply voltage terminal 5 of the pixel driving chip 2 through the supply voltage line VCC to release the sleep state of the pixel driving chip 2, which is corresponding to stage S0 in FIG. 8.

In the stage S3, also referred to as the data signal transmission stage, the second data signal is input to the data signal terminal 4 of the pixel driving chip 2.

As shown in FIG. 8, in the stage S3, the above control chip 9 inputs the second data signals to the plurality of chip columns 200 through the plurality of data signal lines DATA. In the present disclosure, the second data signals are input to the plurality of chip columns 200 at the same time. Each second data signal involves a plurality of subdata information Subdata_1, Subdata_2, . . . , Subdata_N.

Each piece of subdata information includes address information ID and pixel data information. The subdata information may be a digital signal, which may include a start command SoT, the address information ID, a data transmission command DCX, an interval command IoT, the pixel data information, and an end command EoT. The pixel data information includes a plurality of sub-pixel data $Rda_1$, $Rda_2$, $Rda_3$, $Rda_4$, $Gda_1$, $Gda_2$, $Gda_3$, $Gda_4$, $Bda_1$, $Bda_2$, $Bda_3$, and $Bda_4$. When the data transmission command DCX has a set value, it indicates that data transmission is performed. For example, when DCX=1, it indicates data transmission, and when the pixel driving chip 2 identifies that the value of DCX is 1, it transmits the pixel data information in the subdata information to the corresponding pixel. The sub-pixel data $Rda_1$, $Rda_2$, $Rda_3$, and $Rda_4$ represent data information required for respective red sub-pixels in the four pixels 1 connected with the pixel driving chip 2 to emit light, the sub-pixel data $Gda_1$, $Gda_2$, $Gda_3$, and $Gda_4$ represent data information required for respective green sub-pixels in the four pixels 1 connected with the pixel driving chip 2 to emit light, and the sub-pixel data $Bda_1$, $Bda_2$, $Bda_3$, and $Bda_4$ represent data information required for respective blue sub-pixels in the four pixels 1 connected with the pixel driving chip 2 to emit light.

In a specific implementation, a length of each piece of subdata information may be set to 63 bits with 1 bit for the start command SoT, 8 bits for the address information ID, 1 bit for the data transmission command DCX, 1 bit for the interval command IoT, a total of 16 bits for the sub-pixel data $Rda_1$, $Rda_2$, $Rda_3$, and $Rda_4$, a total of 16 bits for the sub-pixel data $Gda_1$, $Gda_2$, $Gda_3$, and $Gda_4$, a total of 16 bits for the sub-pixel data $Bda_1$, $Bda_2$, $Bda_3$, and $Bda_4$, and 2 bits for the end command EoT. In addition, the interval command IoT may be set between any two adjacent subdata information. It may be understood that one pixel driving chip 2 is configured to drive a total of four pixels 1 in one pixel group 8, and a serial number relationship between the four pixels 1 connected with the pixel driving chip 2 may be realized by a digital logic circuit inside the pixel driving chip to accurately distribute each sub-pixel data in the pixel data information to a corresponding signal channel terminal 7.

That is, it may be understood that the address information ID in each piece of subdata information corresponds to the address information ID received by each pixel driving chip 2 in the stage S1, and the pixel data information includes a set of data information of each pixel 1 driven by the pixel driving chip 2.

The plurality of pieces of subdata information may be sequentially arranged in a specific order (which, for example, may be an order in which the plurality of pixel driving chips 2 in each chip column 200 are arranged in the column direction) to form the second data signal, and the plurality of pieces of subdata information may not be arranged in the specific order as described, which is not limited herein.

The second data signal is transmitted to the pixel driving chips 2 in the same column through the data signal line DATA, and each pixel driving chip 2 decodes and matches the address information ID in the plurality of pieces of subdata information in the second data signal, thereby selectively receive the subdata information corresponding to the same address information ID received and stored in the stage S1, and acquiring the pixel data information from the subdata information.

Figure 9:
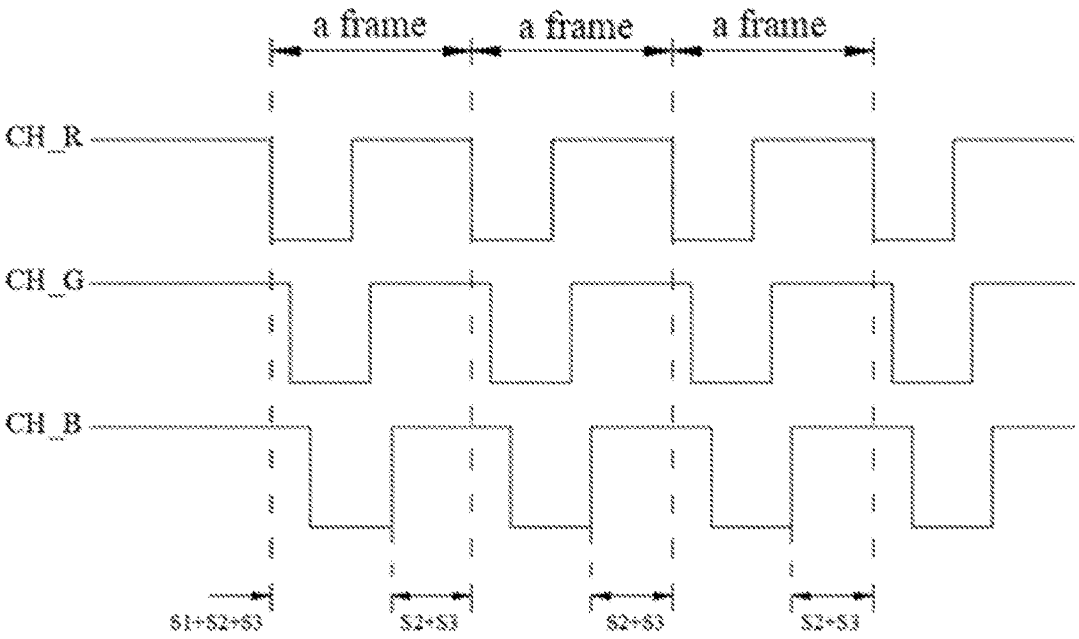
FIG. 9 is a sequence diagram at a signal channel terminal of a pixel driving chip according to an embodiment of the present disclosure.

Each signal channel terminal 7 of the pixel driving chip 2 forms a signal channel with its corresponding sub-pixel. In particular, the pixel driving chip 2 is configured to drive four pixels 1, each of which includes three sub-pixels with different colors, such that the pixel driving chip 2 includes twelve signal channel terminals 7 connected with different sub-pixels respectively. After the stage S3, the pixel driving chip 2 receives and stores data information of the four pixels 1 connected therewith, and the signal channel terminals 7 connected to the sub-pixels with different colors may not be turned on at the same time, such that the sub-pixels with different colors are driven at different times. In particular, as shown in FIG. 4, FIG. 7, and FIG. 9, the signal channel terminals 7 (R1), 7 (R2), 7 (R3), and 7 (R4) connected with the red sub-pixels may be all turned on first, that is, all the red sub-pixels are driven first during the time period when CH_R in FIG. 9 has an active level. Compared to the signal channel terminals 7 (R1), 7 (R2), 7 (R3), and 7 (R4) connected with the red sub-pixels, the signal channel terminals 7 (G1), 7 (G2), 7 (G3), and 7 (G4) connected with the green sub-pixels may be turned on with a delay of several nanoseconds, that is, CH_G in FIG. 9 has an active level at a time later than CH_R, and the green sub-pixels are driven during the time period when CH_G has the active level. Compared to the signal channel terminals 7 (G1), 7 (G2), 7 (G3), and 7 (G4) connected with the green sub-pixels, the signal channel terminals 7 (B1), 7 (B2), 7 (B3), and 7 (B4) connected with the blue sub-pixels may be turned on with a further delay of several nanoseconds, that is, CH_B in FIG. 9 has an active level at a time later than CH_G, and the blue sub-pixels are driven during the time period when CH_B has the active level. In this way, transient load capacity and transient noise of the pixel driving chip 2 can be reduced. And, although the sub-pixels with various colors are driven with a delay of several nanoseconds in timing, it is almost imperceptible to the human eye, and the sub-pixels with various colors are visually illuminated at the same time, allowing for accurate display of full-color images.

Figure 10:
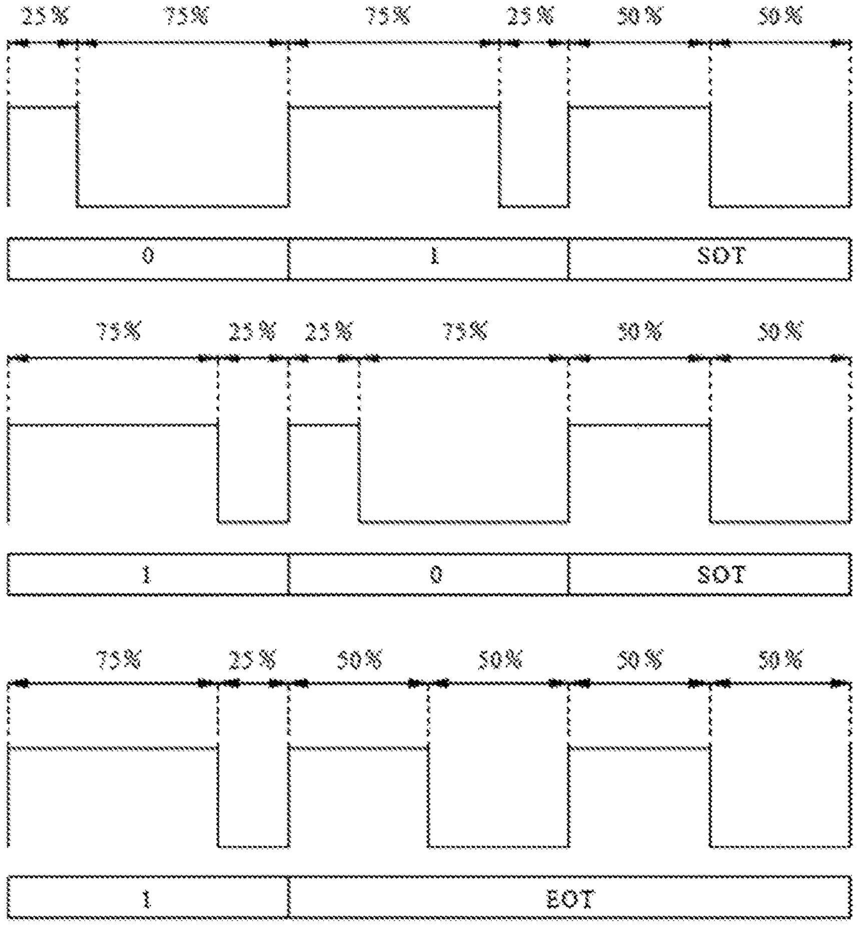
FIG. 10 is a schematic diagram illustrating encoding of data signals according to an embodiment of the present disclosure.

FIG. 10 is a schematic diagram illustrating encoding of first and second data signals according to the present disclosure. As shown in FIG. 10, in the present disclosure, it is possible to indicate the meaning of each bit in the first data signal and the second data signal by designing a duty cycle in a pulse sequence. For example, when the duty cycle of a pulse in the pulse sequence is 25%, it means that the bit represents 0; when the duty cycle of a pulse is 75%, it means that the bit represents 1; when the duty cycle of a pulse is 50%, it means that the bit is the start command SoT; and when the duty cycles of two consecutive pulses are both 50%, i.e., two consecutive SoTs occur, the meaning of the 2 bit is the end command EoT.

As shown in FIG. 8, a display frame of the display panel according to the present disclosure may further include a current setting stage S2 between the address assignment stage S1 and the data signal transmission stage S3. In the current setting stage S2, current setting information Co is input to the data signal terminal 4 of the pixel driving chip 2 to control a magnitude of a driving current of the pixel driving chip 2, thereby further accurately controlling luminous brightness of the corresponding pixel 1. A length of the current setting information Co may be 63 bits, with 1 bit for a start command SoT, 8 bits for address information ID, 1 bit for a current setting command DCX, 1 bit for an interval command IoT, 16 bits for both frame start command C and control command (which, indicates, for example, a current amplitude correction coefficient to be provided to the light-emitting diode at the signal channel terminal 7), 1 bit for the interval command IoT, 16 bits for a reserved control command bit, 1 bit for the interval command IoT, 16 bits for the reserved control command bit, and 2 bits for an end command EoT. When the current setting command DCX has a set value, for example, when DCX is 0, it indicates that the current setting is performed.

It may be understood that in the process of displaying images frame by frame, the display panel may perform the stage S0, stage S1, stage S2, and stage S3 in sequence only before displaying the first frame (that is, active stages of CH_R, CH_G, and CH_B, corresponding to stages in which the pixels are driven), while the display panel may perform only the stage S2 and stage S3, or even only the stage S3, before displaying the frame after the first frame.

It may be understood that the embodiments of the present disclosure have been described by taking a pixel driving chip providing signals to a pixel group with four pixels as an example. If a display panel includes pixels in odd rows or odd columns, the embodiments according to the present disclosure may be used for design and driving, where some signal channel terminals of part of the pixel driving chips may be left hanging (that is, not connected with any components), or a pixel driving chip that provides signals to a pixel group having an odd number of pixels may be provided in the display panel, which is not limited in the present disclosure.

The foregoing are merely preferred embodiments of the present disclosure, and do not limit the present disclosure in any form. Although the present disclosure has been disclosed as above in the preferred embodiments, the present disclosure is not limited thereto. Any person skilled in the art may utilize the technical contents disclosed above to make some variations or modifications into equivalent embodiments with equivalent changes, without departing from the scope of the technical solution of the present disclosure. Any simple variations, equivalent changes and modifications made to the above embodiments based on the technical essence of the present disclosure without departing from the contents of the technical solution of the present disclosure shall fall within the scope of the technical solution of the present disclosure.

The invention claimed is:

1. A display panel, comprising:

a base substrate;

a pixel array disposed on the base substrate, and comprising one or more pixel groups each of which comprises a plurality of pixels; and a plurality of pixel driving chips disposed on the base substrate and configured to drive the pixel array to display, each of the pixel driving chips comprising a data signal terminal configured to receive data signals, and a control signal terminal configured to receive address signals, wherein the control signal terminal is further configured to receive a power supply voltage, and the address signals and the power supply voltage are distinguished from each other by amplitude of a signal received at the control signal terminal, wherein a control function is performed based on the address signals in response to the amplitude of the signal received at the control signal terminal being higher than a preset level, and a power supply function is performed in response to the amplitude of the signal received at the control signal terminal being lower than the preset level, wherein for each of the pixel groups, the plurality of pixels in the pixel group are connected to a common pixel driving chip.

2. The display panel according to claim 1, wherein for each of the pixel groups, multiple pixels of the plurality of pixels are located in different pixel rows in the pixel array.

3. The display panel according to claim 1, wherein for each of the pixel groups, multiple pixels of the plurality of pixels are located in different pixel columns in the pixel array.

4. The display panel according to claim 1, wherein the plurality of pixels in each of the pixel groups are distributed in a single direction.

5. The display panel according to claim 4, wherein the plurality of pixels in each of the pixel groups are located in a same pixel row of the pixel array.

6. The display panel according to claim 4, wherein the plurality of pixels in each of the pixel groups are located in a same pixel column of the pixel array.

7. The display panel according to claim 1, wherein the plurality of pixel driving chips are arranged in at least one chip column, the chip column being parallel to pixel columns in the pixel array, and located between adjacent two of the pixel columns.

8. The display panel according to claim 7, wherein the adjacent two of the pixel columns forms a plurality of pixel groups, the plurality of pixel groups being distributed in an extension direction of the pixel columns, and a plurality of pixel driving chips in the chip column located between the adjacent two of the pixel columns being connected with the plurality of pixel groups in a one-to-one correspondence.

9. The display panel according to claim 7, wherein the plurality of pixel driving chips are arranged in a plurality of chip columns, and two of the pixel columns are located between adjacent two of the chip columns.

10. The display panel according to claim 9, wherein each of the pixels comprises a first sub-pixel, and the display panel further comprises:

a plurality of power signal lines, the first sub-pixels in the two pixel columns located between the adjacent two of the chip columns being connected to a common power signal line.

11. The display panel according to claim 1, further comprising:

a power signal line connected with the pixels, wherein each of the pixels comprises a sub-pixel comprising a light-emitting diode, the power signal line is connected with a positive electrode of the light-emitting diode, and the pixel driving chip is connected with a negative electrode of the light-emitting diode.

12. The display panel according to claim 1, further comprising:

a data signal line connected with the data signal terminal, wherein the data signal line comprises a plurality of data signal lines, the plurality of pixel driving chips are arranged in at least one chip column, and the plurality of pixel driving chips in the chip column have the data signal terminals connected to a common data signal line.

13. The display panel according to claim 1, further comprising:

a control signal line connected with the control signal terminal, wherein the control signal line comprises a plurality of control signal lines, the plurality of pixel driving chips are arranged in at least one chip row, and the plurality of pixel driving chips in the chip row have the control signal terminals connected to a common control signal line.

14. The display panel according to claim 1, further comprising:

a control signal line connected with the control signal terminal;

a data signal line connected with the data signal terminal; and a control chip connected with the control signal line and the data signal line, and configured to provide control signals to the control signal line and to provide the data signals to the data signal line.

15. The display panel according to claim 14, wherein the display panel comprises a display area and a peripheral area surrounding the display area, the pixel driving chips being located in the display area and the control chip being located in the peripheral area.

16. The display panel according to claim 1, wherein each of the pixel driving chips further comprises a ground terminal.

17. The display panel according to claim 1, wherein the pixel array comprises a plurality of pixel rows and a plurality of pixel columns, a number of the pixel rows is an even number, and a number of the pixel columns is an even number.

18. A display apparatus, comprising the display panel according to claim 1.

19. A method of driving a display panel, the display panel comprising:

a base substrate;

a pixel array disposed on the base substrate, and comprising one or more pixel groups each of which comprises a plurality of pixels; and a plurality of pixel driving chips disposed on the base substrate and configured to drive the pixel array to display, each of the pixel driving chips comprising a data signal terminal configured to receive data signals, and a control signal terminal configured to receive address signals, wherein the control signal terminal is further configured to receive a power supply voltage, and the address signals and the power supply voltage are distinguished from each other by amplitude of a signal received at the control signal terminal, wherein a control function is performed based on the address signals in response to the amplitude of the signal received at the control signal terminal being higher than a preset level, and a power supply function is performed in response to the amplitude of the signal received at the control signal terminal being lower than the preset level, wherein for each of the pixel groups, the plurality of pixels in the pixel group are connected to a common pixel driving chip, and wherein a display frame of the display panel comprises an address assignment stage and a data signal transmission stage, the method comprising:

inputting a control signal to the control signal terminal and inputting a first data signal to the data signal terminal in the address assignment stage; and inputting a second data signal to the data signal terminal in the data signal transmission stage.

20. A display panel, comprising:

a base substrate;

a pixel array disposed on the base substrate, and comprising one or more pixel groups each of which comprises a plurality of pixels; and a plurality of pixel driving chips disposed on the base substrate and configured to drive the pixel array to display, each of the pixel driving chips comprising a data signal terminal configured to receive data signals, and a control signal terminal configured to receive address signals, wherein the control signal terminal is further configured to receive a power supply voltage, and the address signals and the power supply voltage are distinguished from each other by amplitude of a signal received at the control signal terminal, wherein for each of the pixel groups, the plurality of pixels in the pixel group are connected to a common pixel driving chip, the plurality of pixel driving chips are arranged in a plurality of chip columns, the plurality of chip columns being parallel to pixel columns in the pixel array, and each located between adjacent two of the pixel columns, and two pixel columns among the pixel columns are located between adjacent two of the plurality of chip columns, and each of the pixels comprises a first sub-pixel, a second sub-pixel, and a third sub-pixel, each of the first sub-pixel, the second sub-pixel, and the third sub-pixel comprises a first electrode and a second electrode, each of the first electrode of the first sub-pixel, the first electrode of the second sub-pixel, and the first electrode of the third sub-pixel is directly connected to a corresponding pixel driving chip of the plurality of pixel driving chips, and the display panel further comprises a plurality of first power signal lines and a plurality of second power signal lines, second electrodes of the first sub-pixels in the two pixel columns located between the adjacent two of the plurality of chip columns being directly connected to a common first power signal line among the plurality of first power signal lines, and second electrodes of the second sub-pixels and second electrodes of the third sub-pixels in the two pixel columns located between the adjacent two of the plurality of chip columns being both directly connected to a common second power signal line among the plurality of second power signal lines.

* * * * *